(12) United States Patent
Liang et al.

(10) Patent No.: US 11,244,593 B2
(45) Date of Patent: Feb. 8, 2022

(54) SHIFT-REGISTER CIRCUIT, GATE-DRIVING CIRCUIT, AND ARRAY SUBSTRATE OF A DISPLAY PANEL

(71) Applicants: BOE TECHNOLOGY GROUP CO., LTD., Beijing (CN); Chongqing BOE Optoelectronics Technology Co., Ltd., Chongqing (CN)

(72) Inventors: Xuebo Liang, Beijing (CN); Xiuzhu Tang, Beijing (CN); Qian Qian, Beijing (CN); Shuai Chen, Beijing (CN); Jingpeng Zhao, Beijing (CN); Taoliang Tang, Beijing (CN); Xing Dong, Beijing (CN); Lijun Xiong, Beijing (CN); Zhenguo Tian, Beijing (CN); Shuang Hu, Beijing (CN)

(73) Assignees: BOE TECHNOLOGY GROUP CO., LTD., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 791 days.

(21) Appl. No.: 16/073,028

(22) PCT Filed: Dec. 12, 2017

(86) PCT No.: PCT/CN2017/115598
§ 371 (c)(1),
(2) Date: Jul. 26, 2018

(87) PCT Pub. No.: WO2019/029071
PCT Pub. Date: Feb. 14, 2019

(65) Prior Publication Data
US 2021/0209994 A1    Jul. 8, 2021

(30) Foreign Application Priority Data
Aug. 11, 2017  (CN) .......................... 201710685926.2

(51) Int. Cl.
*G09G 3/36* (2006.01)
*G09G 3/20* (2006.01)
*G11C 19/28* (2006.01)

(52) U.S. Cl.
CPC ............ *G09G 3/2092* (2013.01); *G11C 19/28* (2013.01); *G09G 2310/0286* (2013.01); *G09G 2310/08* (2013.01)

(58) Field of Classification Search
CPC ........ G09G 2310/0286; G09G 3/3266; G09G 2310/0205; G09G 2310/0243;
(Continued)

(56) References Cited

U.S. PATENT DOCUMENTS 8,331,524 B2 * 12/2012 Hsu .................... G11C 19/00
377/64
2011/0228893 A1    9/2011 Tobita et al.
(Continued)

FOREIGN PATENT DOCUMENTS

| CN | 102779494 A | 11/2012 |
| CN | 103366822 A | 10/2013 |

(Continued)

OTHER PUBLICATIONS

First Office Action in the Chinese Patent Application No. 201710685926.2, dated Jan. 10, 2020; English translation attached.
(Continued)

*Primary Examiner* — Duc Q Dinh
(74) *Attorney, Agent, or Firm* — Intellectual Valley Law, P.C.

(57) ABSTRACT

The present application discloses a shift-register circuit configured as one of a plurality of shift-register units cascaded in series. The shift-register circuit includes a pull-up sub-circuit coupled to a pull-up node, a first clock port, and an output port. The pull-up sub-circuit is configured to pass
(Continued)

a first clock signal from the first clock port to the output port when the pull-up node is set to a turn-on voltage. Additionally, the shift-register circuit includes a chamfering sub-circuit coupled to the pull-up node, the first clock port, a chamfering clock port, and the output port. The chamfering sub-circuit is configured to pass a chamfering clock signal from the chamfering clock port to the output port. The chamfering clock signal is at the turn-on voltage simultaneously with the first clock signal and becomes a turn-off voltage slightly earlier in time than the first clock signal.

20 Claims, 3 Drawing Sheets

(58) Field of Classification Search
CPC ... G09G 2310/0264; G09G 2320/0247; G09G 3/2092; G09G 2310/08; G09G 2310/0267; G09G 2320/0209; G09G 2310/0289; G09G 3/3674; G09G 2320/0257; G11C 19/28; G11C 7/222; G11C 16/32; G11C 27/04
See application file for complete search history.

(56) References Cited

U.S. PATENT DOCUMENTS

| | | | |
|---|---|---|---|
| 2014/0111413 A1 | 4/2014 | Chen et al. | |
| 2014/0219412 A1 | 8/2014 | Chien et al. | |
| 2016/0093264 A1* | 3/2016 | Gu | G09G 3/3677 345/212 |
| 2018/0190227 A1 | 7/2018 | Feng et al. | |

FOREIGN PATENT DOCUMENTS

| | | |
|---|---|---|
| CN | 105895045 A | 8/2016 |
| CN | 106057116 A | 10/2016 |
| CN | 206370275 U | 8/2017 |

OTHER PUBLICATIONS

Second Office Action in the Chinese Patent Application No. 201710685926.2, dated Jul. 31, 2020; English translation attached.

* cited by examiner

SHIFT-REGISTER CIRCUIT, GATE-DRIVING CIRCUIT, AND ARRAY SUBSTRATE OF A DISPLAY PANEL

CROSS-REFERENCE TO RELATED APPLICATION

This application is a national stage application under 35 U.S.C. § 371 of International Application No. PCT/CN2017/115598, filed Dec. 12, 2017, which claims priority to Chinese Patent Application No. 201710685926.2, filed Aug. 11, 2017, the contents of which are incorporated by reference in the entirety.

TECHNICAL FIELD

The present invention relates to display technology, more particularly, to a shift-register circuit, a gate-driving circuit, and an array substrate of a display panel having the same.

BACKGROUND

In the state-of-art narrow frame and low-cost display panel, for example, liquid-crystal display panel, the gate driver on array (GOA) circuit for driving the gate line scanning usually is disposed directly into the array substrate to eliminate space originally reserved for IC bonding and fan-out connection. The GOA circuit is made by cascading multiple shift-register units in multiple stages with the shift-register unit of each stage being configured to output a gate-driving signal (at turn-on voltage) to each corresponding gate line to drive the display panel to progressively display a frame of image.

Each gate line of the display panel is loaded with a plurality of subpixel circuits, which causes a larger time delay in applying gate-driving signal to a subpixel circuit located farther from the output port of the GOA circuit. The subpixel circuits at different locations along the gate line thus will be charged to different voltage levels due to the different time delays, resulting in overall insufficient charging of all subpixels in the display panel and nonuniformity luminance in displayed image. In particular, because a parasitic capacitance exists between each subpixel circuit and a gate line or a data line associated with the subpixel due to their overlapping layout structure on the display panel, any voltage change in the gate line will cause a jump ΔVp of signals in corresponding data line and subpixel circuit. At an end time of each gate-driving signal being outputted as a pulse from a corresponding shift-register unit of the GOA circuit, the voltage level in the gate line almost changes suddenly from a turn-on voltage to a turn-off voltage. The change of the voltage level at the gate line is quite large, causing a large jump ΔVp which easily leads to flicker or blur in the displayed image.

SUMMARY

In an aspect, the present disclosure provides a shift-register circuit configured as one of a plurality of shift-register units The shift-register circuit includes a pull-up sub-circuit coupled to a pull-up node, a first clock port, and an output port. The pull-up sub-circuit is configured to pass a first clock signal from the first clock port to the output port when the pull-up node is set to a turn-on voltage. Additionally, the shift-register circuit includes a storage capacitor having a first terminal coupled to the pull-up node and a second terminal coupled to the output port. Moreover, the shift-register circuit includes a chamfering sub-circuit coupled to the pull-up node, the first clock port, a chamfering clock port, and the output port. The chamfering sub-circuit is configured to pass a chamfering clock signal with the turn-on voltage from the chamfering clock port to the output port simultaneously as the first clock signal is provided at the first clock port and to switch off the chamfering clock signal to a turn-off voltage slightly earlier in time than the first clock signal.

Optionally, the chamfering sub-circuit includes a first transistor coupled to a second transistor. The first transistor includes a gate coupled to the first clock port, a first terminal coupled to the chamfering clock port, and a second terminal coupled to a first terminal of the second transistor. The second transistor includes a gate coupled to the pull-up node, the first terminal coupled to the second terminal of the first transistor, and a second terminal coupled to the output port.

Optionally, the pull-up sub-circuit includes a third transistor having a gate coupled to the pull-up node, a first terminal coupled to the first clock port, and a second terminal coupled to the output port.

Optionally, the shift-register circuit further includes an input sub-circuit coupled to the pull-up node and an input port. The input sub-circuit is configured to pass an input signal from the input port to the pull-up node. The shift-register circuit also includes a reset sub-circuit coupled to the pull-up node, a reset port, and a turn-off voltage port. The reset sub-circuit is configured to pass a turn-off voltage from the turn-off voltage port to the pull-up node.

Optionally, the input sub-circuit includes a fourth transistor having a gate coupled to the input port, a first terminal coupled to the input port, and a second terminal coupled to the pull-up node. The reset sub-circuit includes a fifth transistor having a gate coupled to the reset port, a first terminal coupled to the pull-up node, and a second terminal coupled to the turn-off voltage port.

Optionally, the shift-register further includes a noise-control sub-circuit coupled to the pull-up node, a pull-down node, a first control port, and the turn-off voltage port. The noise-control sub-circuit is configured to pass a first control signal from the first control port to the pull-down node or to pass the turn-off voltage from the turn-off voltage port to the pull-down node depending on a voltage level at the pull-up node. The shift-register circuit also includes a noise-reduction sub-circuit coupled to the pull-down node, the pull-up node, the turn-off voltage port, and the output port. The noise-reduction sub-circuit is configured to pass the turn-off voltage from the turn-off voltage port respectively to the pull-up node and the output port based on a voltage level at the pull-down node.

Optionally, the noise-control sub-circuit includes a sixth transistor, a seventh transistor, an eighth transistor, and a ninth transistor. The sixth transistor has a gate coupled to the pull-up node, a first terminal coupled to the pull-down node, and a second terminal coupled to the turn-off voltage port. The seventh transistor has a gate coupled to a second terminal of the ninth transistor, a first terminal coupled to the first control port, and a second terminal coupled to coupled to the pull-down node. The eighth transistor has a gate coupled to the pull-up node, a first terminal coupled to a second terminal of the ninth transistor, and a second terminal coupled to the turn-off voltage port. The ninth transistor has a gate coupled to the first control port, a first terminal coupled to the first control port.

Optionally, the noise-reduction sub-circuit includes a tenth transistor and an eleventh transistor. The tenth transistor has a gate coupled to the pull-down node, a first terminal coupled to the pull-up node, and second terminal coupled to the turn-off voltage port. The eleventh transistor has a gate coupled to the pull-down node, a first terminal coupled to the output port, and a second terminal coupled to the turn-off voltage port.

Optionally, the shift-register circuit further includes a pull-down sub-circuit coupled to a second control port, the output port, and the turn-off voltage port. The pull-down sub-circuit is configured to pass the turn-off voltage from the turn-off voltage port to the output port controlled by a second control signal provided to the second control port.

Optionally, the pull-down sub-circuit includes a twelfth transistor having a gate coupled to the second control port, a first terminal coupled to the output port, and a second terminal coupled to the turn-off voltage port.

Optionally, each of the first, second, third, fourth, fifth, sixth, seventh, eighth, ninth, tenth, eleventh, and twelfth transistors is an N-type transistor.

Optionally, each of the first, second, third, fourth, fifth, sixth, seventh, eighth, ninth, tenth, eleventh, and twelfth transistors is a P-type transistor.

In another aspect, the present disclosure provides a method of driving the shift-register circuit described herein in an operation cycle of displaying one frame image based on signals respectively provided to the input port, reset port, first clock port, chamfering port, first control port, and the second control port. The method includes, in an output period of the operation cycle, providing the pull-up node with a potential level of the turn-on voltage, providing the turn-on voltage to the first clock port, providing the turn-on voltage to the chamfering clock port, and simultaneously passing the turn-on voltage from the first clock port and the chamfering clock port to the output port. The method further includes, in a chamfering period of the operation cycle, providing the pull-up node with a potential level of the turn-on voltage, providing the turn-on voltage to the first clock port, providing the turn-off voltage to the chamfering clock port, and simultaneously passing the turn-on voltage from the first clock port to the output port and passing the turn-off voltage from the chamfering clock port to the output port.

Optionally, the operation cycle of driving the shift-register circuit includes a scanning period including a first sub-period, a second sub-period, a third sub-period, a fourth sub-period, and a fifth sub-period. During the scanning period the method includes providing the turn-on voltage to the first control port, providing the turn-off voltage to the second control port, providing the turn-off voltage to the turn-off voltage port.

Optionally, the method further includes, in the first sub-period, providing the turn-on voltage to the input port, providing the turn-off voltage to the reset port, and providing the turn-off voltage to the first clock port. Additionally, the method includes, in the second sub-period, providing the turn-off voltage to the input port, providing the turn-off voltage to the reset port, providing the turn-on voltage to the first clock port, and providing the turn-on voltage to the chamfering clock port, thereby passing the turn-on voltage at the first clock port and the turn-on voltage at the chamfering clock port simultaneously to the output port. Furthermore, the method includes in the third sub-period, providing the turn-off voltage to the input port, providing the turn-off voltage to the reset port, providing the turn-on voltage to the first clock port, and providing the turn-off voltage to the chamfering clock port, thereby passing the turn-on voltage at the first clock port and the turn-off voltage at the chamfering clock port simultaneously to the output port. Moreover, the method includes, in the fourth sub-period, providing the turn-off voltage to the input port, providing the turn-on voltage to the reset port, and providing the turn-off voltage to the first clock port. Further, the method includes, in the fifth sub-period, providing the turn-off voltage to the input port and providing a turn-off voltage to the reset port.

Optionally, the operation cycle of driving the shift-register circuit further includes a blank period.

Optionally, the method further includes, in the blank period, providing the turn-off voltage to the first control port, providing the turn-on voltage to the second control port, and providing the turn-off voltage to the turn-off voltage port.

In yet another aspect, the present disclosure provides a gate-driving circuit including a plurality of shift-register circuits described herein.

Optionally, the plurality of shift-register circuits is cascaded in multiple stages from a 1st-stage to an N-th stage. An output port of the shift register circuit of n-th stage is connected to a reset port of the shift-register circuit of (n−1)-th stage and an input port of the shift-register circuit of (n+1)-th stage. A first clock port of the shift-register circuit of (n−1)-th stage is connected to a first clock signal line and a first clock port of the shift-register circuit of n-th stage adjacent to the (n−1)-th stage is connected to a second clock signal line. N is an integer greater than 1, and $2 \leq n \leq N-1$.

In still another aspect, the present disclosure provides an array substrate including a gate-driving circuit described herein.

In yet still another aspect, the present disclosure provides a display apparatus including an array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Accordingly, the present disclosure provides, inter alia, a shift-register circuit, a method of driving the shift-register circuit, a gate-driving circuit, and an array substrate of a display panel having the same that substantially obviate one or more of the problems due to limitations and disadvantages of the related art.

Figure 1:
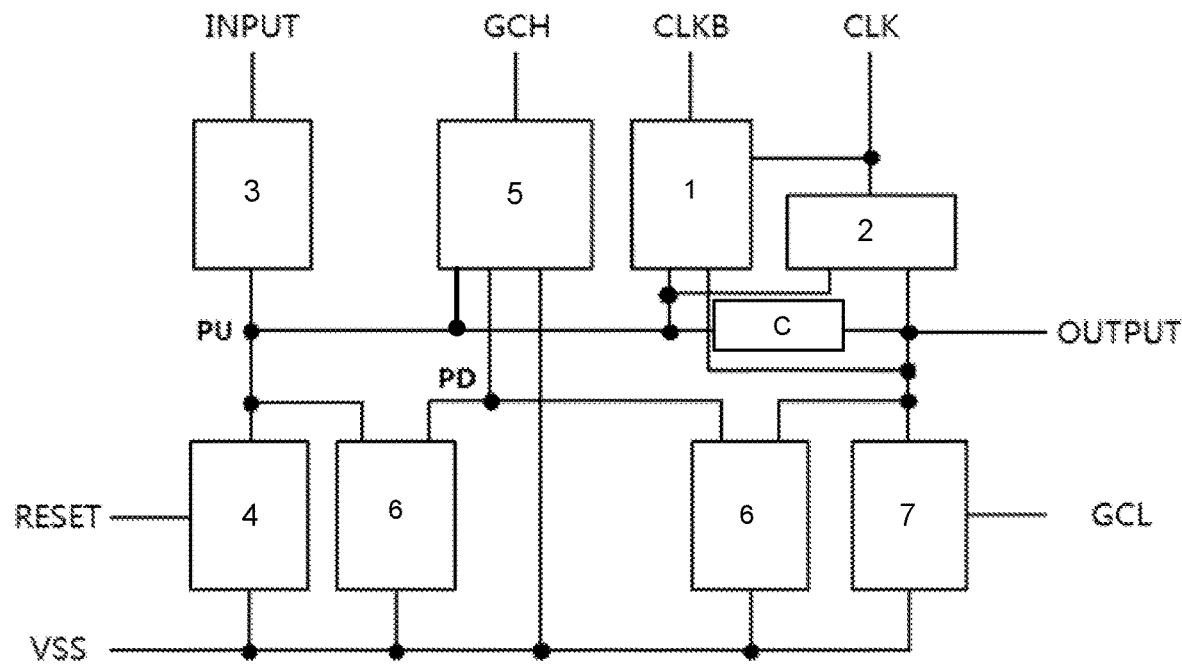
FIG. 1 is a schematic block diagram of a shift-register circuit according to some embodiments of the present disclosure.

In one aspect, the present disclosure provides a shift-register circuit configured as one of a plurality of shift-register units cascaded in multiple stages. FIG. 1 through FIG. 4 shows an embodiment of the shift-register circuit as well as an operation scheme of the circuit configured as a unit of a gate driver on array (GOA) circuit for driving a display panel for displaying images. Referring to FIG. 1, the shift-register circuit includes a pull-up sub-circuit 2 coupled respectively to a pull-up node PU, a first clock signal port CLK, an output port OUTPUT. The pull-up sub-circuit 2 is configured to pass a first clock signal from the first clock signal port to the output port when the pull-up node is set to a turn-on voltage. The shift-register circuit further includes a storage capacitor C having a first terminal coupled to the pull-up node PU and a second terminal coupled to the output port OUTPUT. Additionally, the shift-register circuit includes a chamfering sub-circuit 1 coupled respectively to the pull-up node PU, the first clock signal port CLK, a chamfering clock signal port CLKB, and the output port OUTPUT. The chamfering sub-circuit is configured to pass a chamfering clock signal from the chamfering clock signal port CLKB to the output port OUTPUT when the first clock signal port and the pull-up node are simultaneously provided with or set to a turn-on voltage. A turn-on voltage is referred to a driving voltage capable to turn a switch transistor into a conduction state by connecting its first terminal to its second terminal. Conversely, a turn-off voltage is referred to a voltage that keeps the switch transistor at a block state.

In the embodiment, when the shift-register circuit is operated to output a turn-on voltage as a gate-driving signal at the output port OUTOUT, the chamfering clock signal, which can be a turn-on voltage, from the chamfering clock signal port of the chamfering sub-circuit also can be simultaneously sent to the output port OUTPUT. This means that the shift-register circuit can use two signal sources simultaneously to provide the turn-on voltage as a gate-driving signal to the output port to provide stronger driving power for sufficiently charging all subpixel circuits loaded to the corresponding gate line to achieve uniform luminance for all subpixels along the gate line. In a specific embodiment, before each gate-driving signal changes from the turn-on voltage to the turn-off voltage to finish each corresponding line scan, the chamfering clock signal can be configured to provide the turn-off voltage slightly ahead of a time of the first clock signal being turned to the turn-off voltage. Therefore at the moment when the gate-driving signal at the output port OUTPUT is turned off, the voltage change in the gate line is reduced and do is the corresponding jump ΔVp of signals in the data line and the subpixel circuit associated with the gate line, avoiding flicker or blur in the displayed image.

Optionally, the chamfering sub-circuit 1 includes a first transistor M1 and a second transistor M2. The first transistor M1 has a gate coupled to the first clock signal port CLK, a first terminal coupled to the chamfering clock signal port CLKB, and a second terminal coupled to the first terminal of the second transistor M2. The second transistor M2 also has a gate coupled to the pull-up node PU, a first terminal coupled to the second terminal of the first transistor M1, and a second terminal coupled to the output port OUTPUT.

Both the first transistor M1 and the second transistor M2 are coupled to each other in series between the chamfering clock signal port CLKB and the output port OUTPUT, both of them are respectively controlled by the pull-up node PU and the first clock signal port CLK. When both the pull-up node PU and the first clock signal port CLK are set to turn-on voltage, the signal at the chamfering clock signal port CLKB can be passed to the output port OUTPUT.

Optionally, the pull-up sub-circuit 2 includes a third transistor M3 having a gate coupled to the pull-up node PU, a first terminal coupled to the first clock signal port CLK, and a second terminal coupled to the output port OUTPUT.

Optionally, the shift-register circuit further includes an input sub-circuit 3 coupled to the pull-up node PU and an input port INPUT, and configured to pass a signal from the input port INPUT to the pull-up node PU under a control of the signal of the input port.

Additionally, the shift-register circuit includes a reset sub-circuit 4 coupled to the pull-up node PU, a reset port RESET, and a turn-off voltage port VSS, and configured to pass a turn-off voltage signal from VSS to the pull-up node PU under a control of the reset signal from the reset port RESET.

In an embodiment, the input sub-circuit 3 includes a fourth transistor M4 having a gate coupled to the input port INPUT, a first terminal coupled to the input port INPUT, and a second terminal coupled to the pull-up node PU. The reset sub-circuit 4 includes a fifth transistor M5 having a gate coupled to the reset port RESET, a first terminal coupled to the pull-up node PU, and a second terminal coupled to the turn-off voltage port VSS.

Furthermore, the shift-register circuit includes a noise-control sub-circuit 5 and a noise-reduction sub-circuit 6. The noise-control sub-circuit 5 is coupled to the pull-up node PU, a pull-down node PD, a first control port GCH, and the turn-off voltage port VSS, and is configured to pass a voltage from the first control port GCH or the turn-off voltage port VSS to the pull-down node PD based on the voltage level at the pull-up node PU. The noise-reduction sub-circuit 6 is coupled to the pull-down node PD, the pull-up node PU, the turn-off voltage port VSS, and the output port OUTPUT, and is configured to pass a voltage from the turn-off voltage port VSS respectively to the pull-up node PU and the output port OUTPUT based on the voltage level at the pull-down node PD.

Optionally, the noise-control sub-circuit 5 includes a sixth transistor M6, a seventh transistor M7, an eighth transistor M8, and a ninth transistor M9. The sixth transistor M6 has a gate coupled to the pull-up node PU, a first terminal coupled to the pull-down node PD, and a second terminal coupled to the turn-off voltage port VSS. The seventh transistor M7 has a gate coupled to the second terminal of the ninth transistor M9, a first terminal coupled to the first control port GCH, and a second terminal coupled to the pull-down node PD. The eighth transistor M8 has a gate coupled to the pull-up node PU, a first terminal coupled to the second terminal of the ninth transistor M9, and a second terminal coupled to the turn-off voltage port VSS. The ninth transistor M9 has a gate and a first terminal commonly coupled to the first control port GCH.

Optionally, the noise-reduction sub-circuit 6 includes a tenth transistor M10 and an eleventh transistor M11. The tenth transistor M10 includes agate coupled to the pull-down node PD, a first terminal coupled to the pull-up node PU, and a second terminal coupled to the turn-off voltage port VSS. The eleventh transistor M11 includes a gate coupled to the pull-down node PD, a first terminal coupled to the output port OUTPUT, and a second terminal coupled to the turn-off voltage port VSS.

Moreover, the shift-register circuit includes a pull-down sub-circuit 7 coupled to a second control port GCL, the output port OUTPUT, and the turn-off voltage port VSS, and configured to pass a voltage from the turn-off voltage port VSS to the output port OUTPUT under a control of the second control port GCL.

Optionally, the pull-down sub-circuit includes a twelfth transistor M12 having a gate coupled to the second control port GCL, a first terminal coupled to the output port OUTPUT, and a second terminal coupled to the turn-off voltage port VSS.

Optionally, all transistors in the shift-register circuit are same type of transistor. Optionally, all transistors are N-type transistors. Correspondingly, the turn-on voltage for the N-type transistor is a high voltage level and the turn-off voltage for the N-type transistor is a low voltage level. Optionally, all transistors in the shift-register circuit are P-type transistors. Correspondingly, the turn-on voltage for the P-type transistor is a low voltage level and the turn-off voltage for the P-type transistor is a high voltage level. Optionally, each transistor is a poly-silicon transistor. Optionally, each transistor is an amorphous silicon transistor. Optionally, each transistor is a metal-oxide transistor.

Figure 2:
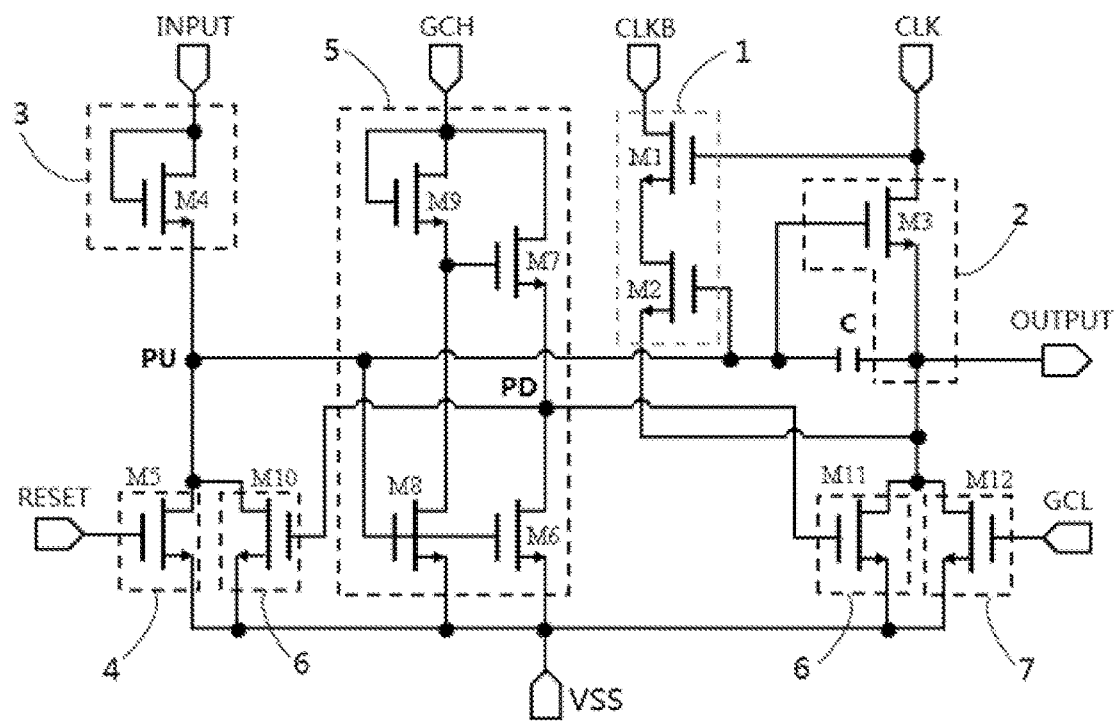
FIG. 2 is a circuit diagram of a shift-register unit according to an embodiment of the present disclosure.

Optionally, the shift-register circuit can be configured differently except that the chamfering sub-circuit, the pull-up sub-circuit, and the storage capacitor C are configured as shown as FIG. 1 and FIG. 2. Optionally, ach shift-register circuit can includes, other than the chamfering clock signal port CLKB, two, or four, or more clock signal ports. Furthermore, the shift-register circuit includes a pull-down sub-circuit 7.

In another aspect, the present disclosure provides a method of driving the shift-register circuit described above. The method includes at least driving the shift-register circuit in an output period and a chamfering period of an operation cycle. In the output period, the method includes setting the pull-up node PU to a turn-on voltage level, providing a turn-on voltage pulse to the first clock signal port CLK providing a turn-on voltage pulse to the chamfering clock signal port CLKB, and simultaneously passing the turn-on voltage from the first clock signal port CLK and the chamfering clock signal port CLKB to the output port OUTPUT. Further in the chamfering period, the method includes setting the pull-up node PU to the turn-on voltage level, providing the turn-on voltage to the first clock signal port CLK, providing a turn-off voltage to the chamfering clock signal port CLKB, and simultaneously pass a turn-on voltage from the first clock signal port CLK and a turn-off voltage from the chamfering clock signal port CLKB to the output port OUTPUT.

As shown in FIG. 1 and FIG. 2, when the first clock signal port provides a turn-on voltage to the output port OUTPUT, once the voltage level at the chamfering clock signal port CLKB is under control, it can provide an enhanced power to drive the shift-register circuit to output a gate-driving signal to avoid image display intensity nonuniformity due to lack of power applied to the subpixel circuits especially for those located along the gate line farther from the output port OUTPUT. At the same time, the control of voltage at the chamfering clock signal port CLKB also leads to reduced ΔVp of signals in the subpixel circuit to prevent flicker or blur from occurring in the displayed image.

Figure 3:
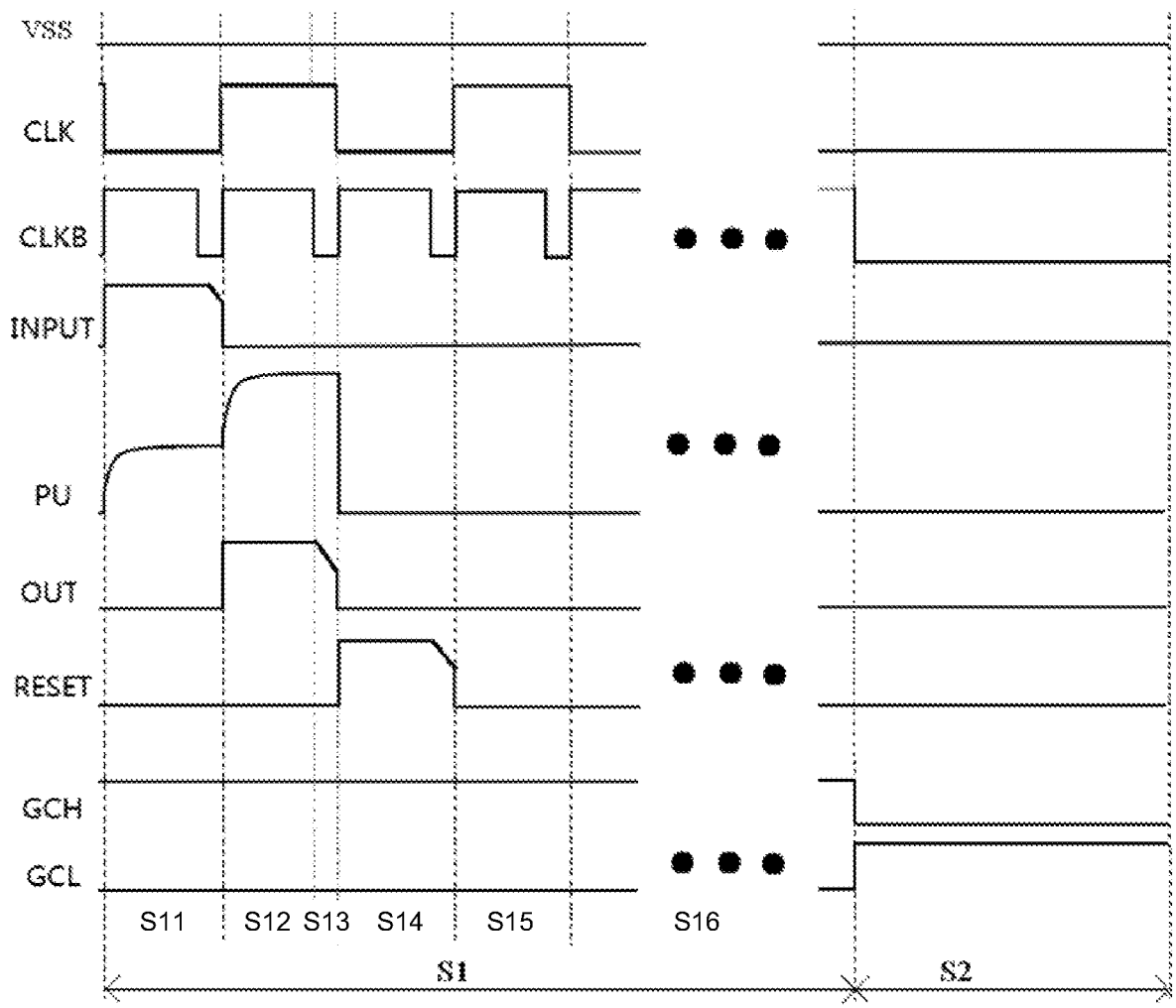
FIG. 3 is a timing waveform of operating a shift-register unit according to an embodiment of the present disclosure.

FIG. 3 is a timing waveform of operating a shift-register unit according to an embodiment of the present disclosure. Referring to FIG. 3, each operation cycle associated with the method includes a scanning period S1 followed by a blank period S2. The scanning period S1 includes a first sub-period S11, a second sub-period S12, a third sub-period S13, a fourth sub-period S14, and a fifth sub-period S15. Here, each transistor in the shift-register circuit uses an N-type transistor.

In the first sub-period S11: the method of driving the shift-register circuit includes providing a high voltage signal to the input port INPUT, a low voltage signal to the reset port RESET, and a low voltage signal to the first clock signal port CLK. Since the input port is at the high voltage, the fourth transistor M4 is turned on to allow the high voltage be passed to the pull-up node PU. Then, the third transistor M3 is turned on by the high voltage at the pull-up node PU and allow the low voltage be passed from the first clock signal port CLK to the output port OUTPUT. Now, the storage capacitor C is charged and the output port of the shift-register circuit outputs a low voltage.

In the second sub-period S12: the method includes providing the input port INPUT with a low voltage, providing the reset port RESET with a low voltage, providing the first clock signal port CLK with a high voltage, and providing the chamfering clock signal port CLKB with a high voltage to simultaneously pass the high voltage from the first clock signal port CLK and the chamfering clock signal port CLKB to the output port OUTPUT. In this sub-period, the first clock signal CLK provides the high voltage to allow the shift-register circuit to output a gate-driving signal at the high voltage. Because of bootstrapping effect of the storage capacitor C, the voltage level at the pull-up node PU is pushed even higher (as a high voltage).

At the same time, the high voltage at the first clock signal port CLK and the pull-up node PU turn on both the first transistor M1 and the second transistor M2. The high voltage at the chamfering clock signal port CLKB is then passed through the first transistor M1 and the second transistor M2 to the output port OUTPUT. In other words, both the chamfering clock signal port CLKB and the first clock signal port CLK are providing high voltage signals to the output port OUTPUT, thereby enhancing the power of driving the shift-register circuit.

In the third sub-period S13: the method includes provides a low voltage to the input port INPUT, providing the reset port RESET with a low voltage, providing the first clock signal port CLK with a high voltage, and providing the chamfering clock signal port CLKB with a low voltage to allow the high voltage at the first clock signal port CLK and the low voltage at the chamfering clock signal port CLKB simultaneously be passed to the output port OUTPUT.

In the third sub-period, the first clock signal port CLK still provides the high voltage to the output port OUTPUT, but the voltage provided at the chamfering clock signal port CLKB becomes a low voltage. Therefore, the voltage level at the output port OUTPUT is pulled lower. By including both the second sub-period S12 and third sub-period S13, the output signal outputted from the output port OUTPUT shows a profile with a trimmed corner. For the case of using N-type transistor, the output signal with trimmed corner is a high voltage signal with a trimmed falling edge. Overall, by the end of the third sub-period S13, the shift-register circuit still outputs a gate-driving signal at a high voltage but with a reduced voltage level. By adjusting a length of the third sub-period S13, a specific value of the reduced voltage level after chamfering can be obtained.

In the fourth sub-period S14: the method includes providing the input port INPUT with a low voltage, providing the reset port RESET with a high voltage, and providing the first clock signal port CLK with a low voltage. In this sub-period, the reset port RESET is provided with a high voltage so that the fifth transistor is turned on to allow a turn-off voltage to be passed from the turn-off voltage port VSS to the pull-up node PU. It also turns off the third transistor M3 again. The signal from the first clock signal port CLK no longer is passed to the output port OUTPUT.

At the same time, since the pull-up node PU is set to a low voltage, the sixth transistor M6 and the eighth transistor M8 are turned off. The high voltage at the first control port GCH can be passed through the ninth transistor M9 to the gate of the seventh transistor M7 to turn on M7. In turn, the high voltage at the first control port GCH is passed to the pull-down node PD. The high voltage at the pull-down node PD then turns on the tenth transistor M10 and the eleventh transistor M11 to pass the turn-off voltage from the turn-off voltage port VSS to respective pull-up node PU and the output port OUTPUT to discharge the storage capacitor C. The shift-register circuit now outputs a low voltage signal.

In the fifth sub-period S15: the method includes providing a low voltage to the input port INPUT, providing a low voltage to the reset port RESET. In this sub-period, both of the input port INPUT and the reset port RESET is set to the low voltage so that the voltage levels at each circuit node is kept the same. The shift-register circuit keeps outputting a low voltage signal. If this shift-register circuit is used as one of multiple shift-register units cascaded in multiple stages, as this shift-register unit of current stage is outputting a low voltage signal, other shift-register units of other stages may sequentially outputting high voltages as gate-driving signals to corresponding gate lines.

Optionally, the shift-register circuit described above can be operated without including the noise-control sub-circuit 5 and the noise-reduction sub-circuit 6 in which the shift-register circuit outputs no signal during the fourth sub-period S14 and the fifth sub-period S15.

In the embodiment, for each shift-register unit among the multiple shift-register units cascaded in a series in multiple stages, the signals at the input port INPUT and the reset port RESET are provided from the output ports of other shift-register units of other stages in the series. Thus, the signals at the input port INPUT and the reset port RESET also have a profile of high voltage level with a trimmed corner at falling edge.

In the embodiment, after the scanning period S1 ends, the operation of the shift-register circuit enters a blank period S2. Within a cycle of displaying one frame of image, only a partial time is used for scanning all gate lines of a display apparatus, while remaining time of the cycle is just the so-called blank period.

In the blank period S2, the method of driving the shift-register circuit includes providing a low voltage signal to the first control port GCH and a high voltage signal to the second control port GCL. In this period, the first control port GCH and the second control port GCL experience a voltage level flip over so that the twelfth transistor M12 is turned on to allow a low voltage from the turn-off voltage port VSS to be passed to the output port OUTPUT. The shift-register circuit now outputs a stable low voltage signal. In the period, since all transistors except the twelfth transistor are turned off the signals provided to other ports can also be terminated. All shift-register circuits are set to the same stage like this until a start of next cycle of entering a scanning period for displaying another frame of image.

Optionally, the blank period S2 and the twelfth transistor M12 in the pull-down sub-circuit 7 may not be employed in operating the shift-register circuit that is cascaded as one unit in one of multiple stages. All shift-register circuits can be operated in an extended sub-period S16 by keeping their signal setup the same as in the fifth sub-period S15 after all gate lines are scanned through until a start of next cycle of displaying another frame of image.

Figure 4:
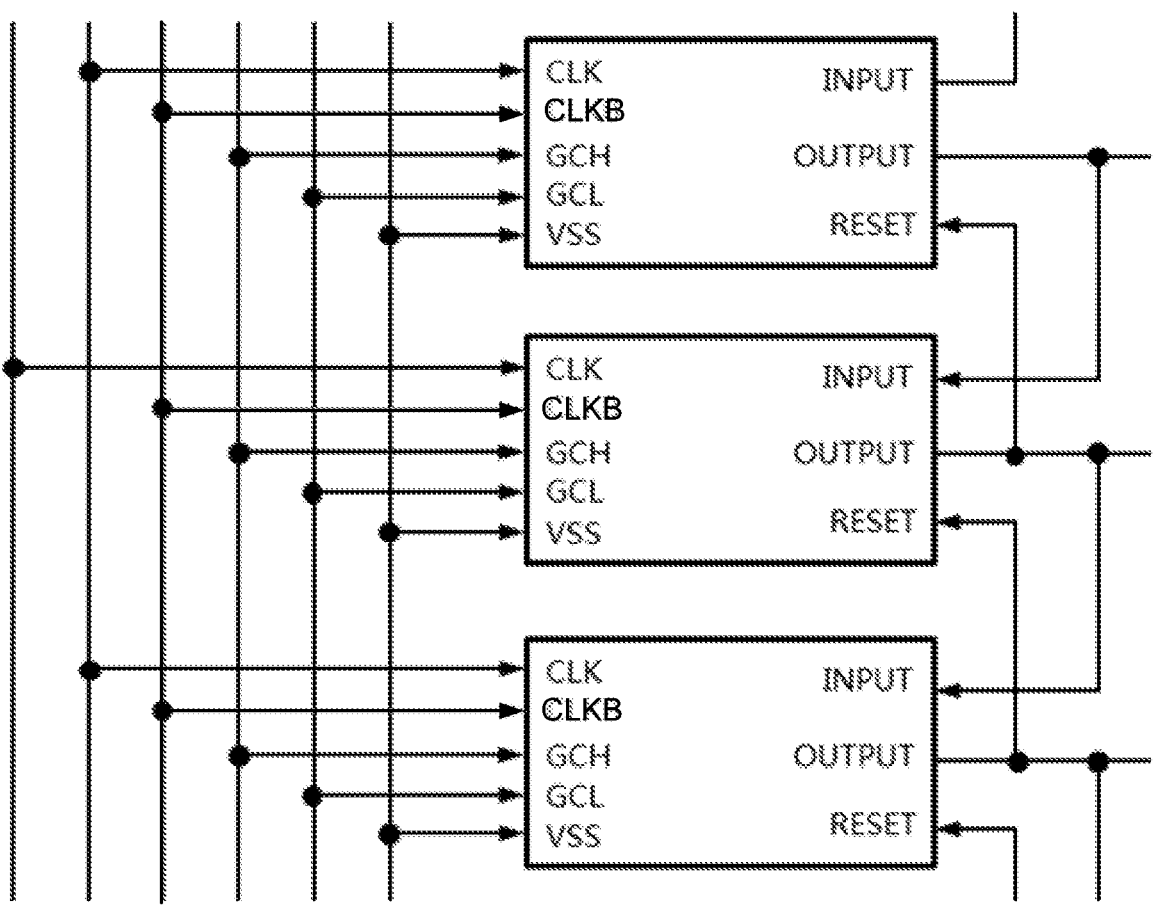
FIG. 4 is a schematic block diagram of a gate-driving circuit according to some embodiments of the present disclosure.

In another aspect, the present disclosure provides a gate-driving circuit including a plurality of shift-register units cascaded in series in which each shift-register unit is a shift-register circuit described herein. FIG. 4 shows a schematic block diagram of a gate-driving circuit according to some embodiments of the present disclosure. In particular, each shift-register unit of current stage (except the first stage) includes an output port OUTPUT connected to a reset port of the shift-register unit of previous stage. The output port OUTPUT of each shift-register unit of current stage (except the last stage) is connected to an input port of the shift-register unit of next stage. Any two shift-register units in adjacent stages have their first clock signal port CLK respectively connected to a first clock signal line and a second clock signal line.

In an embodiment, multiple shift-register circuits shown above are cascaded in multiple stages to form the gate-driving circuit. Each shift-register unit of a stage outputs a gate-driving signal which is also used as an input signal for a shift-register unit of a next stage and alternatively used as a reset signal for a shift-register unit of a previous stage. Of course, the input port INPUT of the shift-register unit of a first stage and the reset port RESET of the shift-register unit of a last stage are configured to receive signals from an external source.

In the embodiment, for two shift-register units of adjacent stages, they are operated in a same state with a time delay of a half period of the first clock signal. Therefore, two clock signal lines are needed to provide two out-phase clock signals, i.e., one in phase with the first clock signal and one out-phase with the first clock signal, respectively to two alternate one of each pair of shift-register units cascaded in multiple stages as shown in FIG. 4. Optionally, each other port of each of the multiple shift-register units can be provided with a corresponding signal from a common line.

In yet another aspect, the present disclosure provides an array substrate including any one of gate-driving circuits described herein. In other words, the shift-register circuit can be formed on an array substrate.

In still another aspect, the present disclosure provides a display apparatus including the array substrate described herein. In particular, the display apparatus includes at least one, but not limited to, of a liquid-crystal display (LCD) panel, a electronic paper, an organic light-emitting diode (OLED) display panel, a smart phone, a tablet computer, a television, a digital displayer, a notebook computer, a digital picture frame, a navigator or any other product or component having a display function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element.

Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift-register circuit configured as one of a plurality of shift-register units, the shift-register circuit comprising:
   a pull-up sub-circuit coupled to a pull-up node, a first clock port, and an output port, the pull-up sub-circuit being configured to pass a first clock signal from the first clock port to the output port when the pull-up node is set to a turn-on voltage;
   a storage capacitor having a first terminal coupled to the pull-up node and a second terminal coupled to the output port; and
   a chamfering sub-circuit coupled to the pull-up node, the first clock port, a chamfering clock port, and the output port, the chamfering sub-circuit being configured to pass a chamfering clock signal with the turn-on voltage from the chamfering clock port to the output port simultaneously as the first clock signal with a high voltage is provided at the first clock port and to switch off the chamfering clock signal to a turn-off voltage slightly earlier in time than the first clock signal being turned to the turn-off voltage or low voltage.

2. The shift-register circuit of claim 1, wherein the chamfering sub-circuit comprises a first transistor coupled to a second transistor, the first transistor having a gate coupled to the first clock port, a first terminal coupled to the chamfering clock port, and a second terminal coupled to a first terminal of the second transistor; the second transistor having a gate coupled to the pull-up node, the first terminal coupled to the second terminal of the first transistor, and a second terminal coupled to the output port.

3. The shift-register circuit of claim 2, wherein the pull-up sub-circuit comprises a third transistor having a gate coupled to the pull-up node, a first terminal coupled to the first clock port, and a second terminal coupled to the output port.

4. The shift-register circuit of claim 3, further comprising:
   an input sub-circuit coupled to the pull-up node and an input port, the input sub-circuit being configured to pass an input signal from the input port to the pull-up node;
   a reset sub-circuit coupled to the pull-up node, a reset port, and a turn-off voltage port, the reset sub-circuit being configured to pass a turn-off voltage from the turn-off voltage port to the pull-up node.

5. The shift-register circuit of claim 4, wherein the input sub-circuit comprises a fourth transistor having a gate coupled to the input port, a first terminal coupled to the input port, and a second terminal coupled to the pull-up node; the reset sub-circuit comprises a fifth transistor having a gate coupled to the reset port, a first terminal coupled to the pull-up node, and a second terminal coupled to the turn-off voltage port.

6. The shift-register circuit of claim 5, further comprising:
   a noise-control sub-circuit coupled to the pull-up node, a pull-down node, a first control port, and the turn-off voltage port, the noise-control sub-circuit being configured to pass a first control signal from the first control port to the pull-down node or to pass the turn-off voltage from the turn-off voltage port to the pull-down node depending on a voltage level at the pull-up node; and
   a noise-reduction sub-circuit coupled to the pull-down node, the pull-up node, the turn-off voltage port, and the output port, the noise-reduction sub-circuit being configured to pass the turn-off voltage from the turn-off voltage port respectively to the pull-up node and the output port based on a voltage level at the pull-down node.

7. The shift-register circuit of claim 6, wherein the noise-control sub-circuit comprises a sixth transistor, a seventh transistor, an eighth transistor, and a ninth transistor, wherein
   the sixth transistor has a gate coupled to the pull-up node, a first terminal coupled to the pull-down node, and a second terminal coupled to the turn-off voltage port;
   the seventh transistor has a gate coupled to a second terminal of the ninth transistor, a first terminal coupled to the first control port, and a second terminal coupled to coupled to the pull-down node;
   the eighth transistor has a gate coupled to the pull-up node, a first terminal coupled to a second terminal of the ninth transistor, and a second terminal coupled to the turn-off voltage port; and
   the ninth transistor has a gate coupled to the first control port, a first terminal coupled to the first control port;
wherein the noise-reduction sub-circuit comprises a tenth transistor and an eleventh transistor, wherein
   the tenth transistor has a gate coupled to the pull-down node, a first terminal coupled to the pull-up node, and second terminal coupled to the turn-off voltage port; and
   the eleventh transistor has a gate coupled to the pull-down node, a first terminal coupled to the output port, and a second terminal coupled to the turn-off voltage port.

8. The shift-register circuit of claim 7, further comprising a pull-down sub-circuit coupled to a second control port, the output port, and the turn-off voltage port, the pull-down sub-circuit being configured to pass the turn-off voltage from the turn-off voltage port to the output port controlled by a second control signal provided to the second control port.

9. The shift-register circuit of claim 8, wherein the pull-down sub-circuit comprises a twelfth transistor having a gate coupled to the second control port, a first terminal coupled to the output port, and a second terminal coupled to the turn-off voltage port.

10. The shift-register circuit of claim 9, wherein each of the first, second, third, fourth, fifth, sixth, seventh, eighth, ninth, tenth, eleventh, and twelfth transistors is an N-type transistor.

11. The shift-register circuit of claim 9, wherein each of the first, second, third, fourth, fifth, sixth, seventh, eighth, ninth, tenth, eleventh, and twelfth transistors is a P-type transistor.

12. A method of driving the shift-register circuit of claim 1 in an operation cycle of displaying one frame image based on signals respectively provided to an input port, a reset port, the first clock port, a chamfering port, a first control port, and a second control port, the method comprising:
   in an output period of the operation cycle, providing the pull-up node with a potential level of the turn-on voltage, providing the turn-on voltage to the first clock port, providing the turn-on voltage to the chamfering clock port, and simultaneously passing the turn-on voltage from the first clock port and the chamfering clock port to the output port; and in a chamfering period of the operation cycle, providing the pull-up node with a potential level of the turn-on voltage, providing the turn-on voltage to the first clock port, providing the turn-off voltage to the chamfering clock port, and simultaneously passing the turn-on voltage from the first clock port to the output port and passing the turn-off voltage from the chamfering clock port to the output port.

13. The method of claim 12, wherein the operation cycle of driving the shift-register circuit comprises a scanning period including a first sub-period, a second sub-period, a third sub-period, a fourth sub-period, and a fifth sub-period, wherein during the scanning period the method comprises providing the turn-on voltage to the first control port, and providing the turn-off voltage to the second control port, providing the turn-off voltage to the turn-off voltage port.

14. The method of claim 13, further comprising, in the first sub-period, providing the turn-on voltage to the input port, providing the turn-off voltage to the reset port, and providing the turn-off voltage to the first clock port;

in the second sub-period, providing the turn-off voltage to the input port, providing the turn-off voltage to the reset port, providing the turn-on voltage to the first clock port, and providing the turn-on voltage to the chamfering clock port, thereby passing the turn-on voltage at the first clock port and the turn-on voltage at the chamfering clock port simultaneously to the output port;

in the third sub-period, providing the turn-off voltage to the input port, providing the turn-off voltage to the reset port, providing the turn-on voltage to the first clock port, and providing the turn-off voltage to the chamfering clock port, thereby passing the turn-on voltage at the first clock port and the turn-off voltage at the chamfering clock port simultaneously to the output port;

in the fourth sub-period, providing the turn-off voltage to the input port, providing the turn-on voltage to the reset port, and providing the turn-off voltage to the first clock port; and in the fifth sub-period, providing the turn-off voltage to the input port and providing a turn-off voltage to the reset port.

15. The method of claim 14, wherein the operation cycle of driving the shift-register circuit further comprises a blank period.

16. The method of claim 15, further comprising, in the blank period, providing the turn-off voltage to the first control port, providing the turn-on voltage to the second control port, and providing the turn-off voltage to the turn-off voltage port.

17. A gate-driving circuit comprising the plurality of shift-register units of claim 1.

18. The gate-driving circuit of claim 17, the plurality of shift-register circuits is cascaded in multiple stages from a 1st-stage to an N-th stage, wherein an output port of the shift-register circuit of an n-th stage is connected to a reset port of the shift-register circuit of a (n−1)-th stage and an input port of the shift-register circuit of the (n+1)-th stage, a first clock port of the shift-register circuit of the (n−1)-th stage is connected to a first clock signal line and a first clock port of the shift-register circuit of the n-th stage adjacent to the (n−1)-th stage is connected to a second clock signal line, where N is an integer greater than 1, and 2≤n≤N−1.

19. An array substrate comprising a gate-driving circuit of claim 17.

20. A display apparatus comprising an array substrate of claim 19.

* * * * *